United States Patent
Rhee et al.

(10) Patent No.: US 7,365,010 B2
(45) Date of Patent: Apr. 29, 2008

(54) SEMICONDUCTOR DEVICE HAVING CARBON-CONTAINING METAL SILICIDE LAYER AND METHOD OF FABRICATING THE SAME

(75) Inventors: Hwa-sung Rhee, Seongnam-si (KR); Hion-suck Baik, Cheonan-si (KR); Dong-suk Shin, Yongin-si (KR); Tetsuji Ueno, Suwon-si (KR); Seung-hwan Lee, Suwon-si (KR); Ho Lee, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 115 days.

(21) Appl. No.: 11/295,784

(22) Filed: Dec. 7, 2005

(65) Prior Publication Data
US 2006/0121660 A1 Jun. 8, 2006

(30) Foreign Application Priority Data
Dec. 8, 2004 (KR) ...................... 10-2004-0103242

(51) Int. Cl.
*H01L 21/44* (2006.01)
(52) U.S. Cl. ................ 438/682; 257/E21.634
(58) Field of Classification Search ............ 438/99, 438/682; 257/E21.201, E21.634
See application file for complete search history.

(56) References Cited

U.S. PATENT DOCUMENTS

| 6,255,704 B1* | 7/2001 | Iwata et al. ............ 257/401 |
|---|---|---|
| 6,743,704 B2 | 6/2004 | Takahashi ............ 438/559 |
| 6,876,045 B2* | 4/2005 | Takagi ............ 257/408 |
| 2002/0005581 A1* | 1/2002 | Kurata ............ 257/756 |
| 2004/0002185 A1 | 1/2004 | Takahashi ............ 438/224 |
| 2005/0062108 A1* | 3/2005 | Nagai ............ 257/388 |
| 2006/0197157 A1* | 9/2006 | Koyama et al. ............ 257/351 |

FOREIGN PATENT DOCUMENTS

| JP | 2004-31691 | 1/2004 |
|---|---|---|
| KR | 10-1998-0011854 | 4/1998 |
| KR | 10-2004-0073645 | 8/2004 |

OTHER PUBLICATIONS

R.A. Donaton, et al.; "Co silicide formation on SiGeC/Si and SiGe/Si layers"; Appl. Phys. Lett. 70 (10), Mar. 10, 1997; 1997 American Institute of Physics; pp. 1266-1268.

* cited by examiner

*Primary Examiner*—W. David Coleman
(74) *Attorney, Agent, or Firm*—Mills & Onello LLP

(57) ABSTRACT

Methods of fabricating semiconductor devices having a carbon-containing metal silicide layer and semiconductor devices fabricated by the methods are provided. A representative method includes the steps of preparing a semiconductor substrate and forming a gate electrode and source/drain regions on the semiconductor substrate, such that the gate electrode has a first metal silicide layer on an upper part thereof which contains carbon and the source/drain regions have second metal silicide layers on their substantially carbon-free upper parts.

28 Claims, 4 Drawing Sheets

SEMICONDUCTOR DEVICE HAVING CARBON-CONTAINING METAL SILICIDE LAYER AND METHOD OF FABRICATING THE SAME

This application claims priority from Korean Patent Application No. 10-2004-0103242 filed on Dec. 8, 2004, in the Korean Intellectual Property Office, the disclosure of which is incorporated herein by reference in its entirety.

BACKGROUND OF THE INVENTION

1. Field of the Invention

The present invention relates to a metal silicide layer of a semiconductor device, to a method of forming the same, and to semiconductor devices comprising such a metal silicide layer, and more particularly, to a metal silicide layer of a semiconductor device which prevents or at least minimizes agglomeration of metal silicide and has a property of improved thermal stability, to a method of forming the same, and to semiconductor devices comprising such a metal silicide layer.

2. Description of the Related Art

Generally, a metal silicide layer is formed as part of a semiconductor device in order to obtain the properties of a low resistance active region and a low resistance gate electrode in a semiconductor device requiring a high processing speed. The metal silicide layer of the semiconductor device lowers contact resistances of the active region and the gate electrode. Such a layer is mainly formed by combining a suitable metal with silicon, to form for example titanium silicide ($TiSi_2$), tungsten silicide ($WSi_2$), cobalt silicide ($CoSi_2$) or nickel silicide ($NiSi_2$).

As the design rule of a semiconductor device is scaled down, the formation of a metal silicide layer becomes increasingly essential. On the other hand, as the design rule of the semiconductor device is scaled down, it also becomes increasingly difficult to ensure a suitable margin for forming the metal silicide layer. Accordingly, it becomes more and more difficult to perform a process of forming the metal silicide layer in the semiconductor device.

Thus, in a case where a line width of a gate electrode is reduced due to miniaturization of a semiconductor device which includes a metal silicide layer according to the prior art, it is difficult to properly form the metal silicide layer on a surface of the gate electrode because agglomeration of metal occurs such that a good metal silicide layer cannot be obtained.

Furthermore, because the metal silicide layer is typically formed on a gate electrode which is formed of n-type or p-type doped polysilicon using a high temperature thermal process in the formation of the metal silicide layer on the semiconductor device according to prior art techniques, a thermal stability property of the metal silicide layer is reduced or impaired due to migration effects occurring along a grain boundary of n-type or p-type doped polysilicon. Moreover, since the grain boundary of the polysilicon is used as a diffusion passage for metal, reliability of the gate oxide layer can also be reduced.

Because it is not necessary to perform the usual high temperature thermal process for the formation of a nickel silicide layer, such a nickel silicide layer will typically demonstrate a better stability than, for example, a cobalt silicide layer relative to a chemical characteristic such as a resistance or a phase shift. However, since agglomeration of nickel silicide often occurs during a subsequent high temperature thermal process used in completing the semiconductor device, the final nickel silicide layer may demonstrate a low thermal stability. Thus, subsequent processing of the semiconductor device performed after formation of the nickel silicide layer must be performed in a limited temperature range not exceeding a silicide formation temperature in order to prevent the agglomeration or the phase shift of the metal silicide. However, in practice, it is frequently difficult or impossible to maintain such a processing temperature restriction in a fabrication process of a semiconductor circuit in which various products are integrated.

Accordingly, applying prior art techniques may adversely affect the thermal stability of a metal silicide layer of a miniature semiconductor device, and/or may also damage other characteristics of the metal silicide layer due to an excessive processing temperature used in a subsequent thermal step in the completion of the semiconductor device. These and other problems with and limitations of the prior art are addressed in whole, or at least in part, by the present invention.

SUMMARY OF THE INVENTION

According to a first aspect of the present invention, there is provided a method of fabricating a semiconductor device including the steps of preparing a semiconductor substrate, and forming a gate electrode and one or more source/drain regions on the semiconductor substrate, wherein the gate electrode has a first metal silicide layer containing carbon on its upper part and the source/drain region(s) has (have) a substantially carbon-free second metal silicide layer on its (their) upper part(s).

According to another aspect of the present invention, there is provided a method of fabricating a semiconductor device including the steps of forming a gate insulating layer on a semiconductor substrate, forming a polysilicon layer on the gate insulating layer wherein the polysilicon layer contains carbon doped in-situ, etching the polysilicon layer to form a gate electrode, and performing a silicidation process on an upper part of the gate electrode to form a first metal silicide layer containing carbon.

According to still another aspect of the present invention, there is provided a method of fabricating a semiconductor device including the steps of forming a gate electrode on a semiconductor substrate, forming source/drain regions at both sides of the gate electrode on the semiconductor substrate, forming epitaxial layers containing carbon on the upper parts of the source/drain regions and/or on the gate electrode, and forming metal silicide layers on at least one of the epitaxial layers.

According to yet another aspect of the present invention, there is provided a semiconductor device comprising a semiconductor substrate, a gate insulating layer formed on the semiconductor substrate and a gate electrode formed on the gate insulating layer, source/drain regions which are formed within the semiconductor substrate at both sides of the gate electrode, a first metal silicide layer containing carbon which is formed on an upper part of the gate electrode, and substantially carbon-free second metal silicide layers formed on upper parts of the source/drain regions.

According to a further aspect of the present invention, there is provided a semiconductor device comprising a semiconductor substrate, a gate electrode formed on the semiconductor substrate which gate electrode includes a gate insulating layer and a polysilicon layer, source/drain regions formed within the semiconductor substrate at both sides of the gate electrode, first epitaxial layers containing carbon which are formed on upper parts of the source/drain regions, and first metal silicide layers which are formed on the first epitaxial layers.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
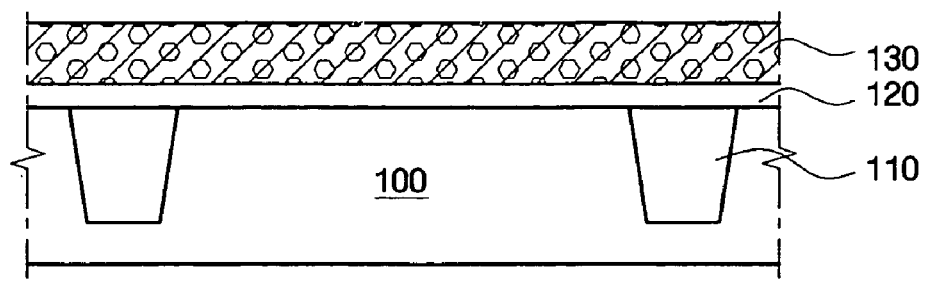
FIGS. 1 and 2 are schematic cross-sectional views illustrating two stages in the formation of a semiconductor device having a metal silicide layer formed by a method of fabricating the same according to one embodiment of the present invention.

The present invention will now be described more fully with reference to the accompanying drawings, in which preferred embodiments of this invention are shown. The present invention may be embodied in many different forms, however, and should not be construed as being limited to the embodiments set forth herein. Rather, these embodiments are provided so that this disclosure will be thorough and complete and will fully convey the concept of the invention to those skilled in the art. The present invention will be further defined by the appended claims. Like reference numerals refer to like elements throughout the specification.

Figure 2:
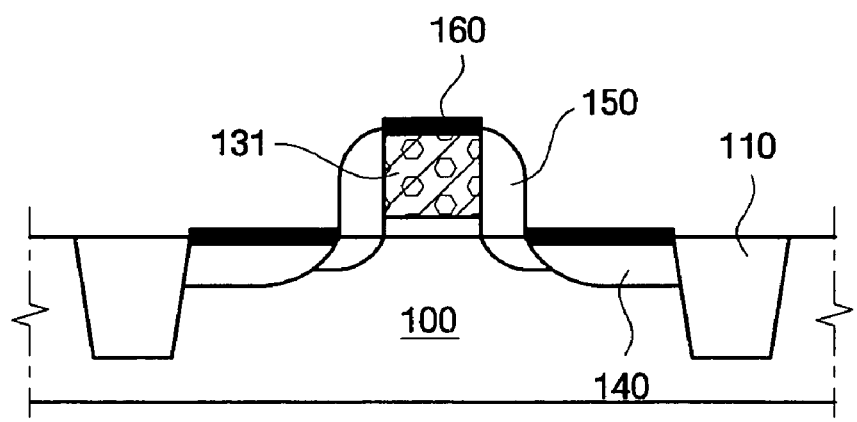

FIGS. 1 and 2 are schematic cross-sectional views illustrating two stages in the formation of a semiconductor structure and the related process for forming a semiconductor device having a metal silicide layer according to one embodiment of the present invention.

Referring to FIG. 1, a semiconductor substrate 100 is etched to form one or more trenches each having a predetermined depth, and the trench(es) may fully circumscribe a region of a desired shape (such as rectangular) on a surface of the substrate. The trench(es) is (are) then filled with an oxide layer to form a field isolation layer 110. An active region of the semiconductor substrate 100 is defined by the field isolation layer 110.

A gate insulating layer 120 and a polysilicon layer 130 are then formed on the semiconductor substrate 100 over the active region defined by the field isolation layer. The polysilicon layer 130 may be formed at a temperature of about 500-700° C. using a low pressure chemical vapor deposition (LPCVD) process. In forming the polysilicon layer 130, for example, a deposition pressure of about 0.05-500 torr may be employed. Useful silicon sources for forming the polysilicon layer 130 include such compounds as $SiH_4$, $Si_2H_6$ and a compound having the general chemical formula $SiCl_xH_y$ (wherein x is an integer from 1 to about 4, and y is 0 or an integer from 1 to about 4, for example, $SiCl_2H_2$ and $SiCl_4$), and similar materials.

The polysilicon layer 130 may be doped with n-type or p-type impurities, particularly, carbon ions. The carbon ions are preferably doped in-situ using a carbon source when depositing the polysilicon layer 130.

Useful carbon sources for doping polysilicon layer 130 with carbon include various hydrocarbons, for example hydrocarbons having the general chemical formula $C_xH_y$ (wherein x and y are independently selected integers from 1 to about 6 inclusive) and silicon-substituted hydrocarbons, for example compounds having the general chemical formula $C_xH_ySiH_z$ (wherein x, y and z are independently selected integers from 1 to about 6 inclusive, for example, $CH_3SiH_3$). For example, $SiH_4$ and $CH_3SiH_3$ may be supplied at flow rates of about 200 sccm (standard cubic centimeter per minute) and 1 sccm, respectively, so that the carbon ions are doped in-situ within the polysilicon layer 130 as it is formed.

Depending on the doping technique selected, the carbon ions doped within the polysilicon layer 130 can have a substantially uniform concentration throughout the polysilicon layer 130. Alternatively, if desired, the doped polysilicon layer 130 can be formed such that a concentration of the carbon ions doped within the polysilicon layer 130 has a gradient varying according to a distance spaced from the gate insulating layer 120. For example, an upper part of the polysilicon layer 130 can be heavily doped to have a higher concentration of the carbon ions than a lower part thereof. Further, when occasion demands, in order to reduce the influence of the polysilicon layer 130 on a characteristic of the underlying gate insulating layer 120, a lower portion of the polysilicon layer 130 which is not doped with carbon ions (by temporarily blocking the carbon source) can be formed up to an initial thickness of, for example, 100 nm or less of the final polysilicon layer 130. Then, the remainder of polysilicon layer 130 in which the carbon ions are doped (by supplying the carbon source) can be formed from the initial thickness up to the desired final thickness of the polysilicon layer 130. In accordance with this invention embodiment, however, at least an upper part of polysilicon layer 130 should include a concentration of carbon ions effective to form a carbon-containing metal silicide layer having improved thermal stability.

Next, referring to FIG. 2, the polysilicon layer 130 seen in FIG. 1 may be patterned using a photolithographic etching process to form a gate electrode 131. Subsequently, gate spacers 150 are formed at both sides of the gate electrode 131. The gate spacer 150 may be formed according to one technique by forming a spacer insulating layer, for example, a silicon nitride layer, on the entire surface of the semiconductor substrate 100 on which the gate electrode 131 is formed and thereafter etching the spacer insulating layer back to a region proximate to the sides of the gate electrode 131.

Subsequently, impurities are implanted into the semiconductor substrate 100 so that source/drain regions 140 are formed to be generally aligned with the gate spacers 150. In a case where the semiconductor substrate 100 is a p-type silicon substrate, n-type impurities would typically be implanted into the semiconductor substrate 100 to form an n-type metal-oxide semiconductor (MOS) transistor. Otherwise, in a case where the semiconductor substrate 100 is an n-type silicon substrate, p-type impurities would typically be implanted into the semiconductor substrate 100 to form a p-type MOS transistor. In some embodiments, it may be advantageous that the source/drain regions 140 be formed so as to include an extended source/drain region. Such an extended source/drain region would be formed to be aligned with the gate electrode 131.

Next, a metal layer for subsequent silicide formation is stacked on the semiconductor substrate 100 on which the gate electrode 131, the source/drain regions 140 and the spacers 150 are formed. Thereafter, a thermal process is performed on the metal layer to promote diffusion of the metal and accompanying silicide formation, thereby respectively forming metal silicide layers 160 on upper parts of the gate electrode 131 as well as on the source/drain regions 140.

When the thermal process for forming the metal silicide layers 160 is performed, the carbon ions contained in the polysilicon within the gate electrode 131 suppress the diffusion of metal ions into gate electrode 131 so that a rapid reaction between metal ions and silicon ions is prevented, thereby improving a characteristic of the silicide being formed. Furthermore, this technique for the formation of the metal silicide layers has also been found to significantly improve the thermal stability of the metal silicide layer 160 formed on the gate electrode 131 with respect to a subsequent thermal process performed on the semiconductor device after the formation of the metal silicide layer 160.

Cobalt, nickel or an alloy layer including both of these metals can be used as the metal layer for silicide formation in accordance with this invention. The thermal process or processes for silicide formation may be performed individually or together using any one or a combination of a rapid thermal processing system, a furnace or a sputtering system. Furthermore, the thermal process is preferably performed at a temperature in the range of 200-700° C.

As described above, using the techniques of this invention, the thermal stability of the metal silicide layer formed on a gate region of a semiconductor device can be ensured without adding a separate process or a photomask for forming the carbon-containing metal silicide layer on the gate electrode.

Figure 3:
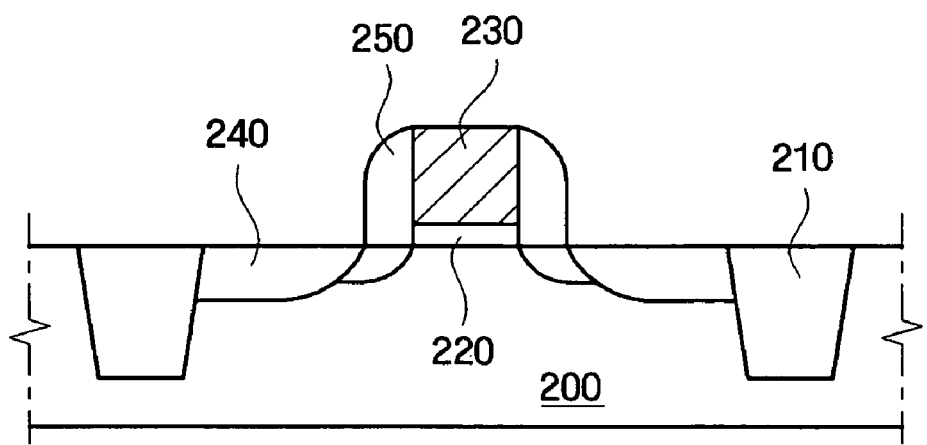
FIGS. 3 through 5 are schematic cross-sectional views illustrating three stages in the formation of a semiconductor device having a metal silicide layer formed by a method of fabricating the same according to another embodiment of the present invention.
Figure 4:
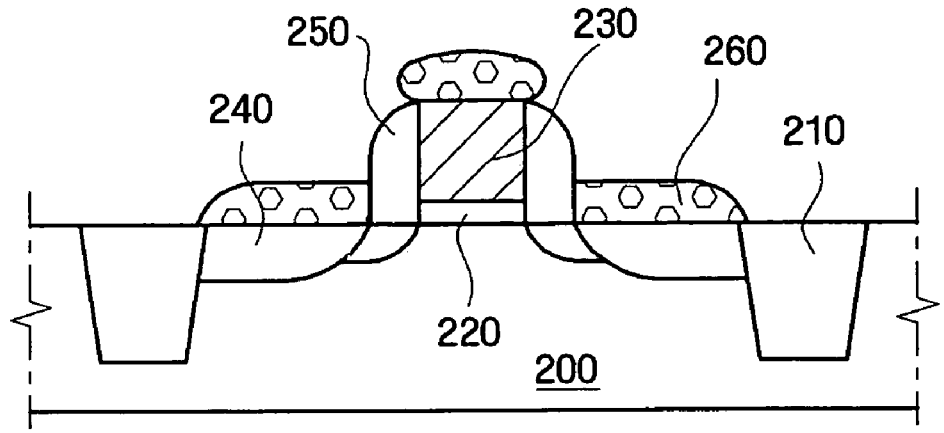
Figure 5:
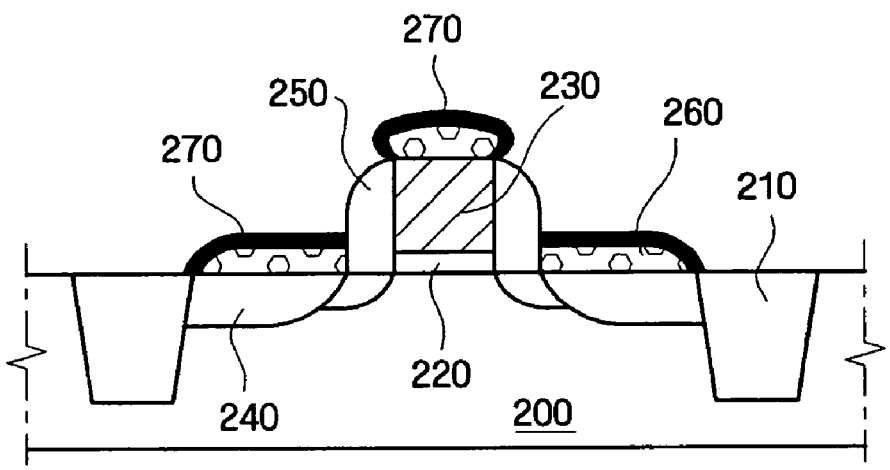

FIGS. 3 through 5 are schematic cross-sectional views illustrating three stages in the formation of semiconductor devices having metal silicide layers according to another embodiment of the present invention.

Referring to FIG. 3, a semiconductor substrate 200 is etched to form one or more trenches each having a predetermined depth, and the trench(es) may fully circumscribe a region of a desired shape (such as rectangular) on a surface of the substrate. The trench(es) is (are) then filled with an oxide layer to form a field isolation layer 210. A gate insulating layer 220 and a polysilicon layer are deposited on an upper part of the semiconductor substrate 200. Then, the polysilicon layer is patterned using a photolithographic etching process to form a gate electrode 230. The polysilicon layer is formed of a conductive material, for example, conductive polysilicon obtained by doping the polysilicon with n-type or p-type impurities.

Subsequently, an oxide layer or a nitride layer is deposited on an upper part of the resulting structure, on which the gate electrode 230 is formed, and the oxide or nitride layer is etched back to form gate spacers 250 at both sidewalls of the gate electrode 230. Impurities are implanted into a surface of an active region of the substrate using the gate electrode 230 and the gate spacers 250 as an ion-implantation mask in order to form source/drain regions 240.

Next, referring to FIG. 4, silicon epitaxial layers 260 are grown over an upper part of the gate electrode 230 seen in FIG. 3 as well as over upper parts of the source/drain regions 240 which are exposed between the gate electrode 230 and both the sidewalls of the gate spacer 250 on one side, and the field isolation layer 210 on the other side.

At this time if not previously accomplished during the epitaxial layer formation step, the epitaxial layers 260 are doped with n-type or p-type impurities, particularly, carbon ions. The carbon ions may be doped in-situ using a suitable carbon source when growing the silicon epitaxial layers 260.

The carbon ions can be doped within the epitaxial layers 260 so as to have a substantially uniform concentration throughout the epitaxial layers 260. In other embodiments, however, when occasion demands, a concentration of the carbon ions doped within the epitaxial layers 260 can be formed so as to have a gradient varying according to a distance spaced from the semiconductor substrate 200 or from the gate electrode 230. For example, an upper part of an epitaxial layer 260 can be heavily doped to have a higher concentration of the carbon ions than a lower part thereof. In accordance with this invention embodiment, however, at least an upper part of epitaxial layer 260 should include a concentration of carbon ions effective to form a carbon-containing metal silicide layer having improved thermal stability.

Next, as shown in FIG. 5, the epitaxial layers 260 seen in FIG. 4 are silicided so that metal silicide layers 270 are formed on the upper parts of the epitaxial layers 260 on gate electrode 230 and on the source/drain regions 240, respectively.

According to the present invention embodiment, the metal silicide layers 270 are formed on the carbon-containing epitaxial layers 260 grown over not only the upper part of the gate electrode 230 but also over the source/drain regions 240. Accordingly, damage to or impairment of a characteristic of the source/drain regions 240 can be prevented during a subsequent thermal process used in completing the semiconductor device.

In order to form the carbon-containing metal silicide layers on the epitaxial layers grown over the source/drain regions, instead of using the in-situ doping process previously discussed in connection with FIGS. 3 through 5, the epitaxial layers can be grown and then carbon can be doped on the epitaxial layers, for example, by ion implantation. The process of forming such carbon-containing metal silicide layers by the ion implantation process will be further described with reference to FIGS. 6 through 8.

Figure 6:
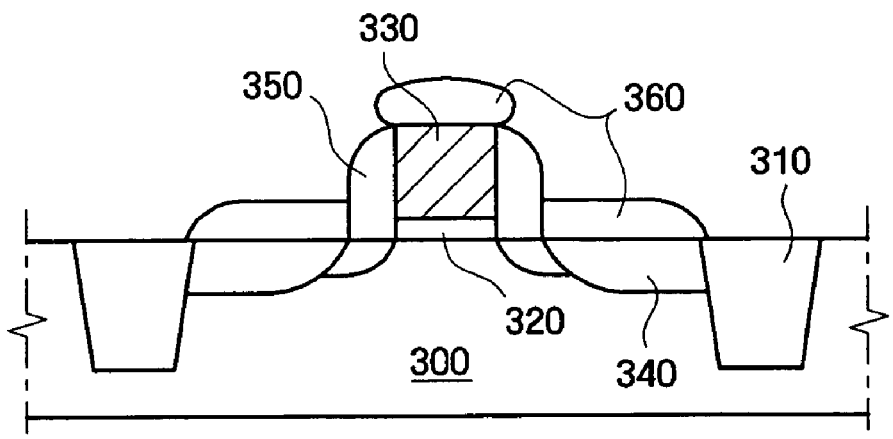
FIGS. 6 through 8 are schematic cross-sectional views illustrating three stages in the formation of a semiconductor device having a metal silicide layer formed by a method of fabricating the same according to still another embodiment of the present invention.
Figure 7:
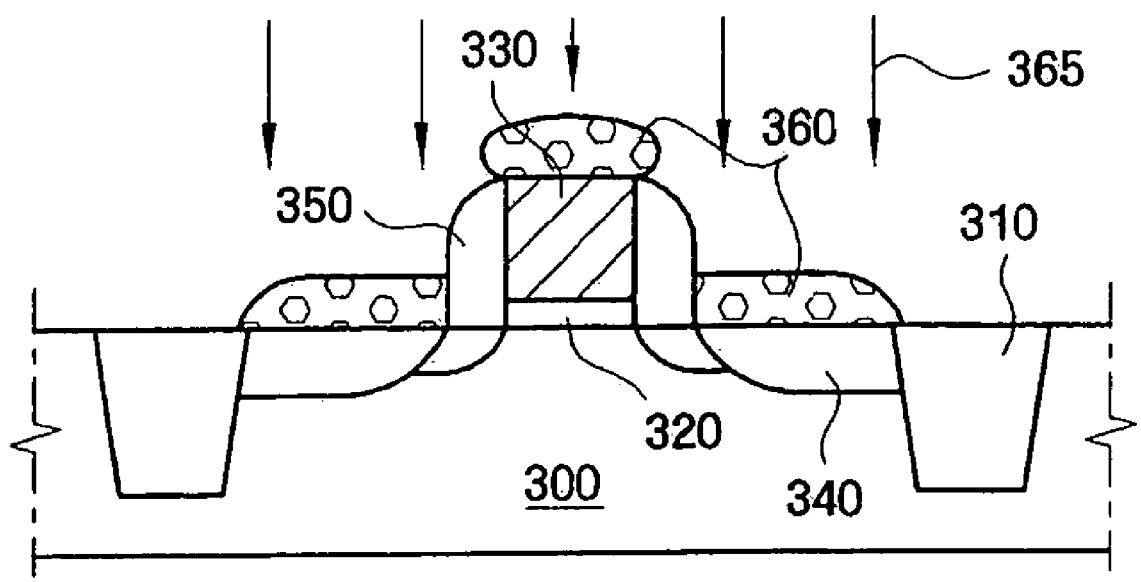
Figure 8:
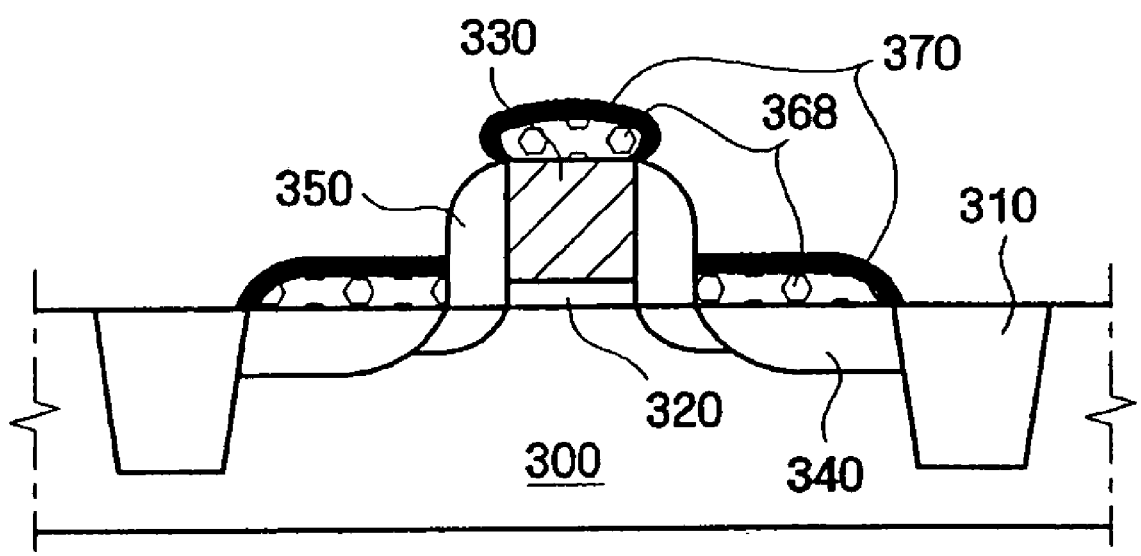

FIGS. 6 through 8 are schematic cross-sectional views illustrating three stages in the formation of semiconductor devices having metal silicide layers according to still another embodiment of the present invention.

First, the above-described semiconductor formation processes (previously discussed with reference to FIG. 3) are performed so that a gate electrode 330, source/drain regions 340 and gate spacers 350 are formed on a semiconductor substrate 300.

Subsequently, referring to FIG. 6, epitaxial layers 360 are grown over an upper part of the gate electrode 330 as well as over upper parts of the source/drain regions 340. At this time if not previously accomplished during the epitaxial layer formation step, the epitaxial layers 360 are doped with n-type or p-type impurities.

Referring to FIG. 7, carbon ions 365 can be effectively doped on the epitaxial layers 360 by ion implantation. The ion implantation process can be carried out such that the carbon ions 365 are doped within the epitaxial layers 360 so as to have a substantially uniform concentration throughout the epitaxial layers 360. In other embodiments, however, when occasion demands, a concentration of the carbon ions 365 doped within the epitaxial layers 360 can be formed so as to have a gradient varying according to a distance spaced from the semiconductor substrate 300 or from the gate electrode 330. For example, the carbon ions can be doped by controlling ion implantation conditions such that a concentration of the carbon ions will have a peak value in a specific portion or region of each epitaxial layer 360. In accordance with this invention embodiment, however, at least an upper part of epitaxial layer 360 should include a concentration of carbon ions effective to form a carbon-containing metal silicide layer having improved thermal stability.

Next, as shown in FIG. 8, the epitaxial layers 360 are silicided so that metal silicide layers 370 are formed on the upper part of the gate electrode 330 as well as on the source/drain regions 340, respectively.

According to the present invention embodiment, the metal silicide layers 370 are formed on the carbon-containing epitaxial layer 360 grown over the upper part of the gate electrode 330, and also on the carbon-containing epitaxial layers 360 grown over the source/drain regions 340. Accordingly, damage to or impairment of a characteristic of the source/drain regions 340 can be prevented during a subsequent thermal process used in completing the semiconductor device.

Although the carbon ions can be implanted into each of the epitaxial layers formed respectively on the upper part of the gate electrode 330 and the source/drain regions 340, and then the silicide layers can be formed on each such carbon-containing epitaxial layer, in other embodiments of this invention the carbon ions can be implanted into only one of either the upper part of the gate electrode 330 or the source/drain regions 340. For example, the carbon ions can be implanted into only the gate electrode 330 but not into the source/drain regions 340 using a proper mask pattern so that the metal silicide layer containing carbon can be formed only over gate electrode 330.

Figure 9:
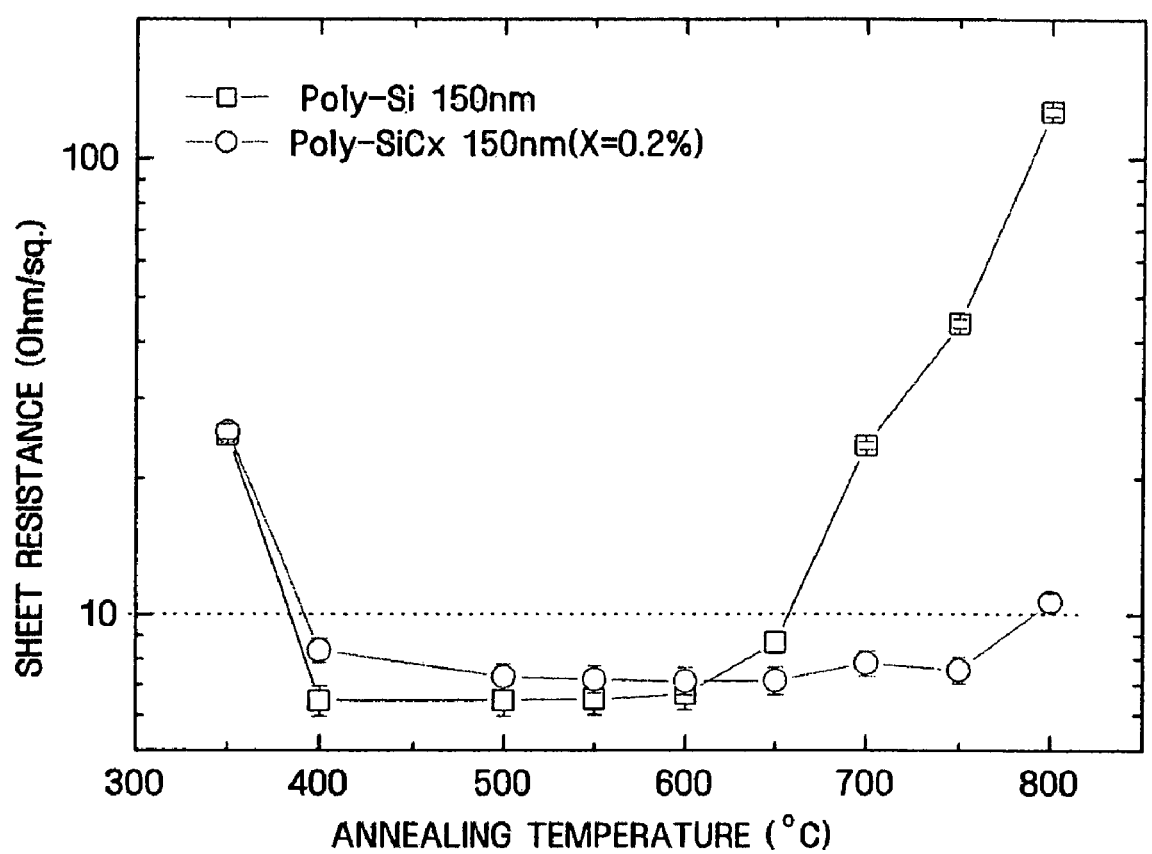
FIG. 9 is a graph comparing the characteristics of two semiconductor devices after performing a high temperature thermal process on each semiconductor device, wherein one of the semiconductor devices has a carbon-containing metal silicide layer formed according to an embodiment of the present invention and the other semiconductor device has a metal silicide layer formed according to the prior art techniques.

FIG. 9 is a graph comparing changes in sheet resistances after performing a high temperature thermal process. (annealing) on two differently prepared metal silicide layers, one prepared according to the present invention (represented by circles) and the other a metal silicide layer prepared according to the prior art (represented by squares). In both preparations, a silicon oxide layer was first grown over a semiconductor substrate to a thickness of 100 nm. Then, a polysilicon layer was formed on the silicon oxide layer, in one case according to the prior art (without added carbon) and in a second case according to the present invention wherein carbon ions were doped in-situ. In both cases, the polysilicon layers were formed using a LPCVD process at a temperature of 650° C., respectively. Next, nickel ions were doped on the respective polysilicon layers to a thickness of 10 nm using a sputtering process, and then a high temperature thermal process was performed on the devices for 1 minute. During the thermal treatment, the sheet resistance of each of the two semiconductor devices was measured. The results of these tests are plotted on the graphs of FIG. 9.

As seen in the graphs of FIG. 9, sheet resistances of metal silicide/polysilicon layers prepared according to the present invention and according to the prior art technique are quite similar, ranging about 5-7 ohm/sq., at relatively low thermal treatment temperatures of about 400° C. up to about 650° C. Above about 650° C., however, FIG. 9 shows a dramatic divergence in the sheet resistance properties of the two metal silicide/polysilicon layers. Whereas the sheet resistance of the metal silicide/polysilicon layer prepared according to the prior art (in which carbon ions are not doped into the polysilicon) begins to increase—rapidly above a temperature of 650° C., the sheet resistance of the metal silicide/polysilicon layer prepared according to the present invention (in which carbon ions are doped into the polysilicon), increases only slightly to about 10.7 ohm/sq. even at a temperature of 800° C. Accordingly, it can be seen that a metal silicide/polysilicon layer prepared according to the present invention (in which carbon ions are doped into the polysilicon), has a higher thermal stability, i.e., remains thermally stable at a temperature 150° C. □ or more above the temperature at which the metal silicide/polysilicon layer prepared according to the prior art experiences rapid deterioration in sheet resistance properties.

As described above, in semiconductor devices and fabrication methods according to the present invention, a polysilicon layer containing carbon, or an epitaxial layer containing carbon, is provided to prevent any significant increase in a sheet resistance (and the accompanying reduction in performance characteristics) during a thermal process for forming a metal silicide layer on the polysilicon or epitaxial layer and/or during a thermal process performed subsequent to formation of the metal silicide layer. Therefore, electrical characteristics and yield of semiconductor devices prepared in accordance with this invention are improved relative to similar devices prepared according to prior art techniques.

In concluding the detailed description, those skilled in the art will appreciate that many variations and modifications can be made to the preferred embodiments as described above and as shown in the drawings without substantially departing from the principles of the present invention. Therefore, the disclosed preferred embodiments of the invention should be interpreted in a generic and descriptive sense only and not used for purposes of limitation.

What is claimed is:

1. A method of fabricating a semiconductor device comprising the sequential steps of:
    preparing a semiconductor substrate; and
    forming a gate electrode and at least a source/drain region on the semiconductor substrate, wherein the gate electrode has a first metal silicide layer on an upper part thereof which contains carbon ions, and wherein the source/drain region has a second metal silicide layer on at least an upper part thereof which is substantially carbon-free,
    wherein the step of forming the gate electrode comprises the substeps of:
    forming a gate electrode containing carbon ions on at least an upper part thereof; and
    performing a silicidation process on the upper part of the gate electrode to form the first metal silicide layer.

2. The method of claim 1, wherein the step of forming the gate electrode comprises the substeps of:
    forming a gate insulating layer on the semiconductor substrate;
    forming a polysilicon layer containing carbon ions on the gate insulating layer; and
    etching the polysilicon layer containing carbon ions to form the gate electrode containing carbon.

3. The method of claim 2, wherein the substep of forming of the polysilicon layer containing carbon ions comprises the steps of forming the polysilicon layer containing carbon ions such that a concentration of carbon ions within the polysilicon layer containing carbon ions becomes higher as a distance from the gate insulating layer increases.

4. A method of fabricating a semiconductor device comprising the sequential steps of:
   forming a gate electrode on a semiconductor substrate;
   forming source/drain regions on both sides of the gate electrode on the semiconductor substrate;
   forming an epitaxial layer containing carbon ions on at least an upper part of the gate electrode; and
   forming a metal silicide layer on the epitaxial layer.

5. The method of claim 4, wherein the step of forming an epitaxial layer containing carbon ions comprises the substeps of:
   growing the epitaxial layer on the upper part of the gate electrode; and
   implanting carbon ions into the epitaxial layer to form an epitaxial layer containing carbon ions.

6. A semiconductor device comprising:
   a semiconductor substrate;
   a gate insulating layer formed on the semiconductor substrate and a gate electrode formed on the gate insulating layer, wherein at least an upper part of the gate electrode includes a concentration of carbon ions;
   source/drain regions having substantially carbon-free upper parts which are formed within the semiconductor substrate at both sides of the gate electrode; and
   a first metal silicide layer which is formed on the carbon-containing upper part of the gate electrode and second metal silicide layers formed on the substantially carbon-free upper parts of the source/drain regions.

7. The semiconductor device of claim 6, wherein the gate electrode includes a polysilicon layer containing carbon ions in at least an upper part thereof.

8. The semiconductor device of claim 6, wherein the gate electrode includes a carbon-free region in a lower part thereof.

9. The semiconductor device of claim 7 wherein a concentration of carbon ions in the polysilicon layer is substantially uniform through the polysilicon layer.

10. The semiconductor device of claim 7, wherein a concentration of carbon ions in the polysilicon layer has a gradient varying according to the distance from the gate insulating layer.

11. The semiconductor device of claim 10, wherein a concentration of carbon ions within the polysilicon layer becomes higher as a distance from the gate insulating layer increases.

12. A semiconductor device comprising:
   a semiconductor substrate;
   a gate electrode formed of polysilicon on a gate insulating layer on the semiconductor substrate;
   source/drain regions formed within the semiconductor substrate at both sides of the gate electrode;
   first epitaxial layers containing carbon ions formed on upper parts of the source/drain regions; and
   first metal silicide layers formed on the first epitaxial layers.

13. The semiconductor device of claim 12, further comprising:
   a second epitaxial layer containing carbon ions formed on an upper part of the gate electrode; and
   a second metal silicide layer formed on the second epitaxial layer.

14. The semiconductor device of claim 12, wherein the gate electrode includes a carbon-free region in a lower part thereof.

15. The semiconductor device of claim 13, wherein a concentration of carbon ions in the first and second epitaxial layer is substantially uniform through the polysilicon layer.

16. The semiconductor device of claim 13, wherein a concentration of carbon ions in the first and second epitaxial layers becomes higher as a distance from the gate insulating layer increases.

17. A semiconductor device comprising:
   a substrate;
   a gate insulating layer on the substrate;
   a gate electrode containing carbon ions on the gate insulating layer;
   source/drain regions in the substrate; and
   a metal silicide layer directly formed on the gate electrode.

18. The semiconductor device of claim 17, wherein the gate electrode comprises a polysilicon layer containing carbon ions at least in an upper part thereof.

19. The semiconductor device of claim 18, wherein a concentration of carbon ions in the polysilicon layer is substantially uniform through the polysilicon layer.

20. The semiconductor device of claim 18, wherein a concentration of carbon ions in the polysilicon layer has a gradient varying according to the distance from the gate insulating layer.

21. The semiconductor device of claim 20, wherein the concentration of carbon ions within the polysilicon layer becomes higher as a distance from the gate insulating layer increases.

22. A semiconductor device comprising:
   a substrate;
   a gate insulating layer on the substrate;
   a gate electrode on the gate insulating layer;
   an epitaxial layer containing carbon ions on the gate electrode; and
   source/drain regions in the substrate.

23. A semiconductor device comprising:
   a substrate;
   a gate insulating layer on the substrate;
   a gate electrode on the gate insulating layer;
   source/drain regions in the substrate; and
   a metal silicide layer on the gate electrode,
   wherein the metal silicide layer contains carbon ions.

24. The semiconductor device of the claim 23, further comprising:
   an epitaxial layer between the gate electrode and the first metal silicide layer.

25. The semiconductor device of claim 23, wherein the gate electrode comprises a polysilicon layer containing carbon ions on at least an upper part thereof.

26. The semiconductor device of claim 25, wherein a concentration of carbon ions in the polysilicon layer is substantially uniform through the polysilicon layer.

27. The semiconductor device of claim 25, wherein a concentration of carbon ions in the polysilicon layer has a gradient varying according to the distance from the gate insulating layer.

28. The semiconductor device of claim 27, wherein a concentration of carbon ions within the polysilicon layer becomes higher as a distance from the gate insulating layer increases.

* * * * *